April 3, 1962 F. D. ROSI ET AL 3,028,341

SUPERCONDUCTORS

Filed July 6, 1960 3 Sheets-Sheet 1

INVENTORS
FRED D. ROSI &
BY JOSEPH J. HANAK
W. S. Hill
AGENT

INVENTORS
FRED D. ROSI &
BY JOSEPH J. HANAK
W. S. Hill
AGENT

INVENTORS
FRED D. ROSI &
JOSEPH J. HANAK
BY W.S. Hill
AGENT

United States Patent Office 3,028,341

Patented Apr. 3, 1962

3,028,341

SUPERCONDUCTORS

Fred D. Rosi, Plainsboro, and Joseph J. Hanak, Princeton, N.J., assignors to Radio Corporation of America, a corporation of Delaware Filed July 6, 1960, Ser. No. 41,079

10 Claims. (Cl. 252—518)

This invention relates to improved superconducting materials. More particularly, this invention relates to superconducting materials which are solid solutions of at least two superconducting compounds, and improved methods of making said materials.

Superconducting materials are utilized to fabricate rapid cryogenic switches and computer components, such as the cryotron. An important parameter of superconducting materials is the temperature at which the material is no longer superconducting. This parameter is a fixed characteristic of each superconducting material and is known as the critical temperature $T_C$. The critical temperature may be considered as the center of the temperature region which marks the transition between the superconducting state and the normal state of the material.

A number of superconducting elements and compounds are known, each of which has its own specific value for the critical temperature. In general, these elements and compounds cannot be mixed at will to obtain alloys or solutions with intermediate values for the critical temperature, since the superconducting elements and compounds are not always miscible, and since such mixtures and alloys are not always superconducting. For a discusison of the parameters such as atomic volume and electron-to-atom ratio which relate to the superconductivity of mixtures and alloys, see the article by B. T. Matthias in "Progress in Low Temperature Physics," edited by T. O. Gorter, North-Holland Publishing Company, Amsterdam, 1953, vol. 2, page 138. For some device purposes it is desirable to tailor the critical temperature of a superconducting material to a predetermined value.

Accordingly, it is an object of this invention to provide improved superconducting materials.

Another object of this invention is to provide an improved superconductor which is a solid solution of at least two superconducting compounds.

Still another object is to provide superconducting materials from which a selection can be made of a material having a predetermined value of critical temperature over a relatively wide temperature range.

These and other objects are attained according to the invention by providing a composition which is a solid solution of at least two compounds from the group consisting of $Nb_3Sn$, $V_3Sn$, and $Ta_3Sn$. The critical temperature of the superconducting composition according to the invention may thus be varied continuously over the relatively wide temperature range from 2.8° K. to 18° K.

The invention will be described in greater detail in conjunction with the accompanying drawing, in which.

Figure 1:
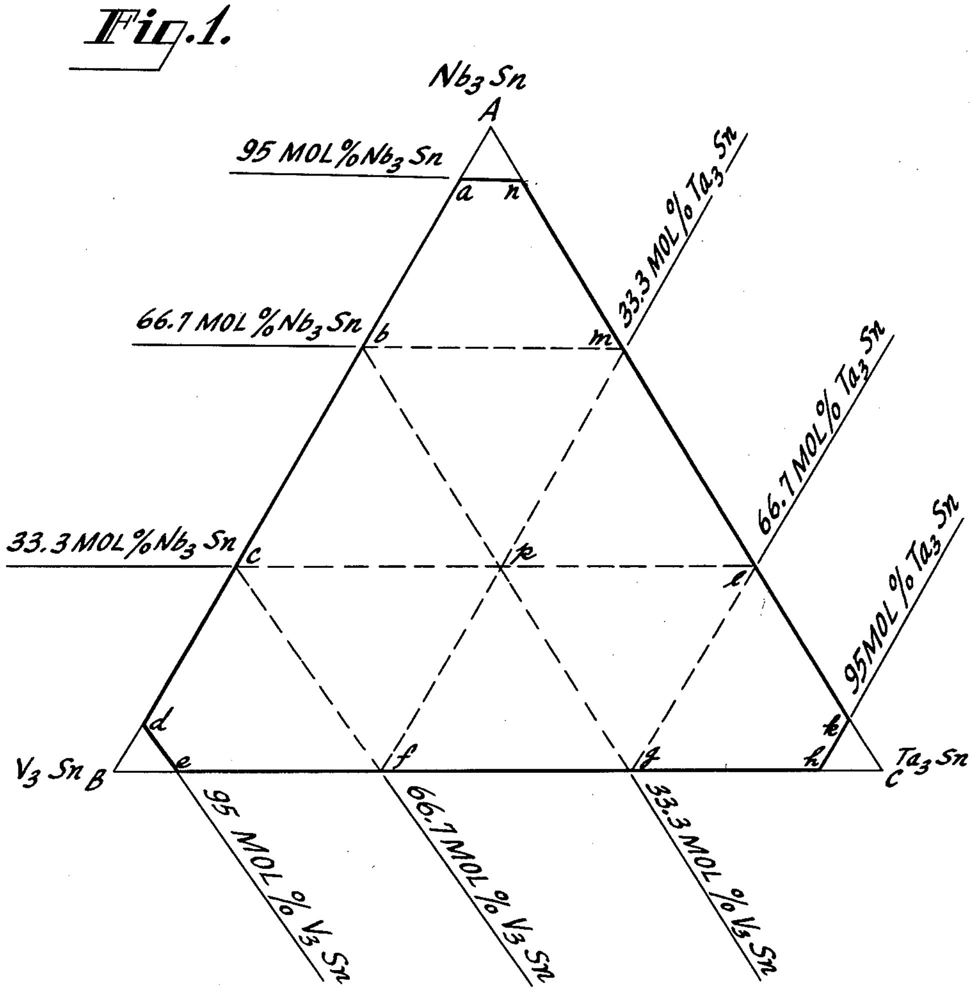
FIGURE 1 is a graph showing the composition of super conducting materials according to the invention.

Referring to FIGURE 1, the compositions according to the invention are represented in the triangular graph by the area within polygon abcdefghklmna. The three vertices A, B and C of the triangle represent 100 mol percent $Nb_3Sn$, 100 mol percent $V_3Sn$, and 100 mol percent $Ta_3Sn$, respectively. Decreasing amounts of each of these compounds is indicated by the distance from the vertex which represents the pure compound to the opposite side of the triangle. Thus the side of the triangle opposite the $Nb_3Sn$ vertex A represents compositions which do not contain any $Nb_3Sn$, but vary in composition from pure $V_3Sn$ at vertex B to pure $Ta_3Sn$ at vertex C. The point *a* on the graph represents 95 mol percent $Nb_3Sn$–5 mol percent $V_3Sn$; the point *b* represents 66.7 mol percent $Nb_3Sn$–33.3 mol percent $V_3Sn$, which is the composition equivalent to $Nb_2VSn$; the point *c* represents 33.3 mol percent $Nb_3Sn$–66.7 mol percent $V_3Sn$, which is the composition equivalent to $NbV_2Sn$; the point *d* represents 95 mol percent $V_3Sn$–5 mol percent $Nb_3Sn$; the point *e* represents 95 mol percent $V_3Sn$–5 mol percent $Ta_3Sn$; the point *f* represents 66.7 mol percent $V_3Sn$–33.3 mol percent $Ta_3Sn$, which is the composition equivalent to $V_2TaSn$; the point *g* represents 33.3 mol percent $V_3Sn$–66.7 mol percent $Ta_3Sn$, which is the compositon equivalent to $VTa_2Sn$; the point *h* represents 95 mol percent $Ta_3Sn$–5 mol percent $V_3Sn$; the point *k* represents 95 mol percent $Ta_3Sn$–5 mol percent $Nb_3Sn$; the point *l* represents 66.7 mol percent $Ta_3Sn$–33.3 mol percent $Nb_3Sn$, which is the composition equivalent to $Ta_2NbSn$; the point *m* represents the composition 33.3 mol percent $Ta_3Sn$–66.7 mol percent $Nb_3Sn$, which is the compositon equivalent to $TaNb_2Sn$; and the point *n* represents 95 mol percent $Nb_3Sn$–5 mol percent $Ta_3Sn$. The composition corresponding to point *n* may also be written as $Nb_{2.85}Ta_{0.15}Sn$. The composition of point *p* is 33.3 mol percent $Nb_3Sn$–33.3 mol percent $Ta_3Sn$–33.3 mol percent $V_3Sn$, and is equivalent to NbTaVSn. Thus each of the compositions according to the invention may be regarded as consisting of one gram molecular weight of tin combined with three gram molecular weights of a mixture of at least two elements from the group consisting of niobium, vanadium, and tantalum.

Stated alternatively, the compositions according to the invention may be regarded as $Nb_aTa_bV_cSn$, where the sum of subscripts $a+b+c$ is always equal to three and not more than one of the subscripts *a*, *b* and *c* may be equal to zero.

Figure 2:
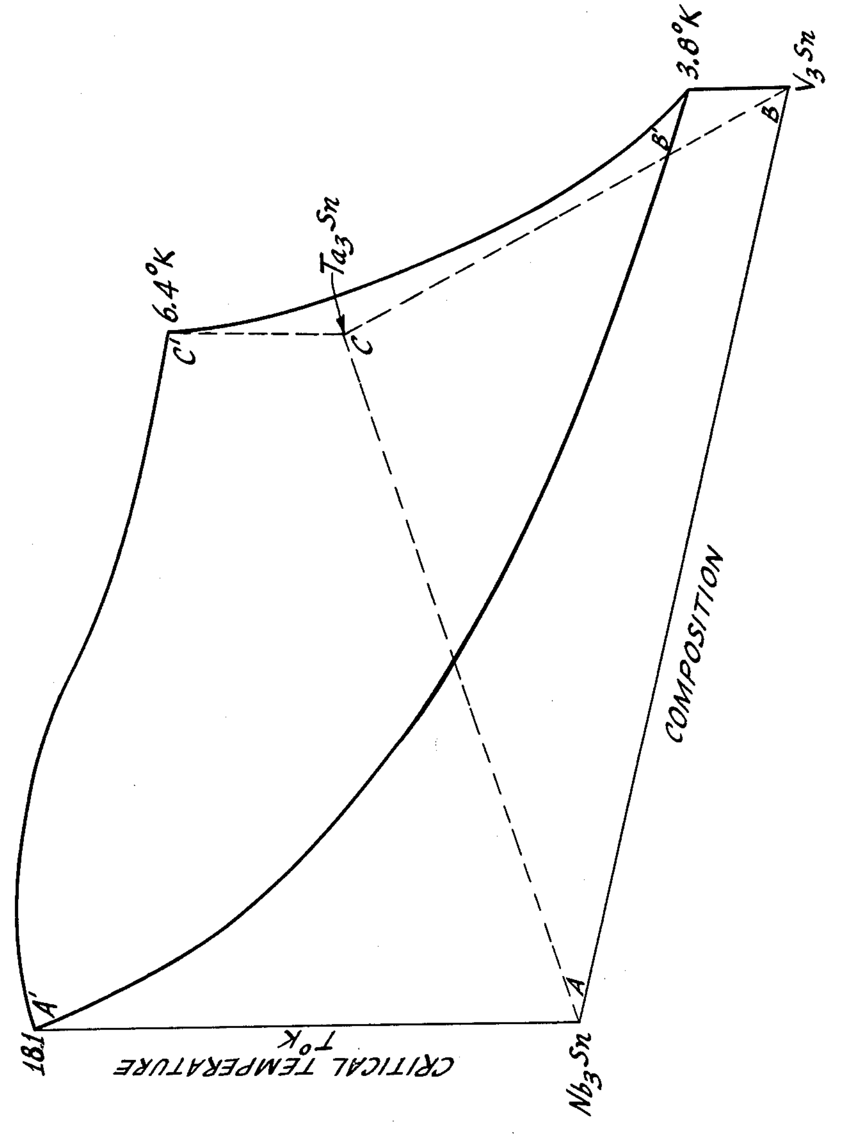
FIGURE 2 is a plot showing the variation of critical temperature with the composition of superconducting materials according to the invention; and, FIGURE 3 is a projection of the plot of FIGURE 2 on the V-Ta plane showing the variation of transition temperature with composition.

The critical temperature for each composition of the invention is plotted in FIGURE 2, which is a two-dimensional representation of a three-dimensional figure. The composition of each material is represented by a point in the ground plane triangle ABC, wherein vertex A represents 100 mol percent $Nb_3Sn$, B represents 100 mol percent $V_3Sn$, and C represents 100 mol percent $Ta_3Sn$, as in FIGURE 1 above. The critical temperature for any composition according to the invention is found by measuring the height of a perpendicular from the point in the ground plane triangle ABC which represents that composition to the curved three-dimensional surface A'B'C'. The point A' represents the value of the critical temperature (18.1° K.) for pure $Nb_3Sn$; the point B' represents the value of the critical temperature (3.8° K.) for pure $V_3Sn$; and point C' represents the value of the critical temperature (6.4° K.) for 100 mol percent $Ta_3Sn$. A minimum value of 2.8° K. exists for the critical temperature of the composition corresponding to $TaV_2Sn$. It is accordingly seen from FIGURE 2 that compositions according to the invention may be prepared with a predetermined critical temperature having any desired value between 2.8° K. and 18° K.

Figure 3:
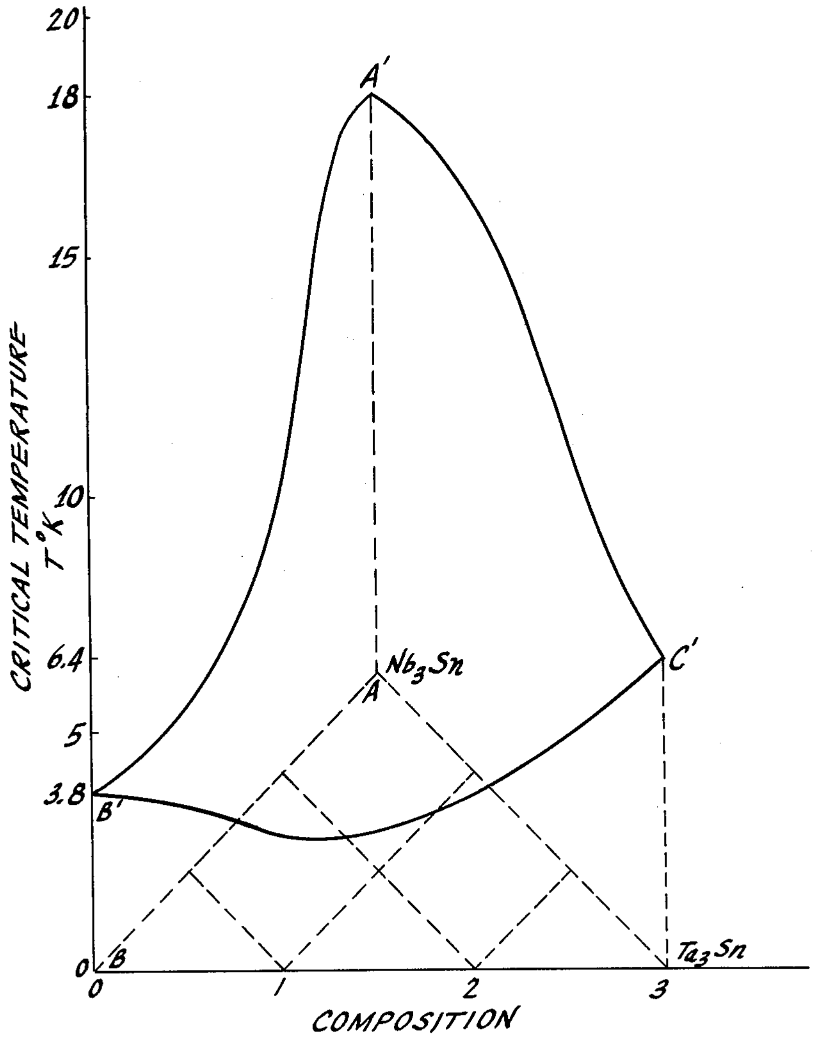

FIGURE 3 is another plot of the critical temperature corresponding to each composition of the invention. FIGURE 3 is obtained by projecting the curved surface A'B'C' of FIGURE 2 on the plane which includes B, B', C and C'. In FIGURE 3, the point A' corresponds to the point A' of FIGURE 2, the point B' corresponds to the point B' of FIGURE 2, etc. The compositions corresponding to each critical temperature in FIGURE 3 are located within the triangle ABC, wherein A represents 100 mol percent $Nb_3Sn$, B represents 100 mol percent $V_3Sn$ and C represents 100 mol percent $Ta_3Sn$. However, in FIGURE 2, A'B'C' is a three-dimensional curved surface, while in FIGURE 3, A'B'C' is a two-dimensional flat surface, and hence FIGURE 3 is easier to utilize for some purposes.

The compositions of the invention are prepared by powdering the component compounds separately, thoroughly mixing the powdered components in the ratio desired, and heating the powdered mixture in vacuum to a temperature of about 600° C. to 700° C. The mixture is maintained at this temperature for about one hour so as to effect a partial reaction between the components. The exact heating time is not critical and may for example vary from about one-half to two hours. After cooling to room temperature, the partially reacted mixture is pulverized, then pressed into a piece of the desired size and shape. The pressed piece is then vacuum sintered at 1200° C. The exact heating time for the second sintering step is not critical, and may vary from about two hours to about two days. It is preferred to utilize longer heating periods if the original starting powders were coarse. If the original powdered compounds were 300 mesh, a heating period of two hours at 1200° C. is sufficient. For coarser powders, longer heating periods are utilized. The resulting composition is single-phase, and exhibits only one transition temperature.

In Table I, examples of various superconducting compositions according to the invention are listed, together with the corresponding critical temperature $T_c$ for each composition, and the corresponding width of the transition region.

*Table I*

| Compound | Critical Temperature (° K.) | Width of Transition (° K.) |
|---|---|---|
| $Nb_{27.5}Ta_{.25}Sn$ | 17.8 | 0.5 |
| $Nb_{2.5}Ta_{.5}Sn$ | 17.6 | 0.7 |
| $Nb_2TaSn$ | 16.4 | 3.2 |
| $V_{.5}Nb_{2.5}Sn$ | 14.2 | 0.5 |
| $Nb_2Va_{.5}Ta_{.5}Sn$ | 12.2 | 0.6 |
| $NbTa_2Sn$ | 10.8 | 3.0 |
| $VNb_2Sn$ | 9.8 | 1.0 |
| NbVTaSn | 6.2 | 1.3 |
| $V_2NbSn$ | 5.5 | 1.4 |
| $Ta_2VSn$ | 3.7 | 0.3 |
| $V_{1.5}Ta_{1.5}Sn$ | 3.1 | 0.3 |
| $TaV_2Sn$ | 2.8 | 0.3 |

Although the mass, molar volume, D-shell structure and lattice constants of $Nb_3Sn$, $V_3Sn$ and $Ta_3Sn$ vary considerably, and the phase equilibrium studies of the Nb-V and Ta-V systems show that there may not be complete solid misibility in these binary metal systems, it has now been found that these three compounds are miscible in all proportions and superconducting in all proportions. It is thought that the influence of the electron-to-atom ratio, which is 4.75 for all three compounds, and of the crystal structure, which is beta-tungsten for all three compounds, predominates over the effect of varying molar volume and varying mass and lattice constants for the three compounds.

There have thus been described improved superconducting compositions which may be tailored so as to exhibit any desired critical temperature in the temperature range between 2.8° K. and 18° K., as well as improved methods of preparing said compositions.

What is claimed is:

1. A composition of matter consisting essentially of a solid solution of at least two compounds from the group consisting of $Nb_3Sn$, $Ta_3Sn$, and $V_3Sn$, the amount of each said compound present being at least 5 mol percent.

2. A composition of matter consisting essentially of a solid solution of 66.7 mol percent $Nb_3Sn$ and 33.3 mol percent $Ta_3Sn$.

3. A composition of matter consisting essentially of a solid solution of 66.7 mol percent $Ta_3Sn$ and 33.3 mol percent $Nb_3Sn$.

4. A composition of matter consisting essentially of a solid solution of 66.7 mol percent $Nb_3Sn$ and 33.3 mol percent $V_3Sn$.

5. A composition of matter consisting essentially of a solid solution of 66.7 mol percent $V_3Sn$ and 33.3 mol percent $Ta_3Sn$.

6. A composition of matter consisting essentially of a solid solution of ⅓ mol $V_3Sn$, ⅓ mol $Ta_3Sn$ and ⅓ mol $Nb_3Sn$.

7. A composition of matter consisting essentially of a solid solution of $V_3Sn$ and $Nb_3Sn$, the amount of each constituent present in said composition being at least 5 mol percent.

8. A composition of matter consisting essentially of a solid solution of 66.7 mol percent $V_3Sn$ and 33.3 mol percent $Nb_3Sn$.

9. A composition of matter consisting essentially of a solid solution of 66.7 mol percent $Ta_3Sn$ and 33.3 mol percent $V_3Sn$.

10. The method of fabricating a solid solution of at least two compounds from the group consisting of $Nb_3Sn$, $Ta_3Sn$, and $V_3Sn$, the amount of each said compound present being at least 5 mol percent comprising the steps of mixing the powdered compounds, heating the mixture to a temperature of about 600° C. to 700° C., pulverizing said heated mixture, pressing said pulverized mixture to the desired shape, and vacuum sintering said pressed mixture at a temperature of about 1200° C.

References Cited in the file of this patent

Matthias et al.: Superconductivity of $Nb_3Sn$—Physical Review, vol. 95, No. 6, Sept. 15, 1954, page 1435.

Cryogenic Devices in Logical Circuitry and Storage—Electrical Manufacturing, February 1958, pages 78–83.